Figure 1:
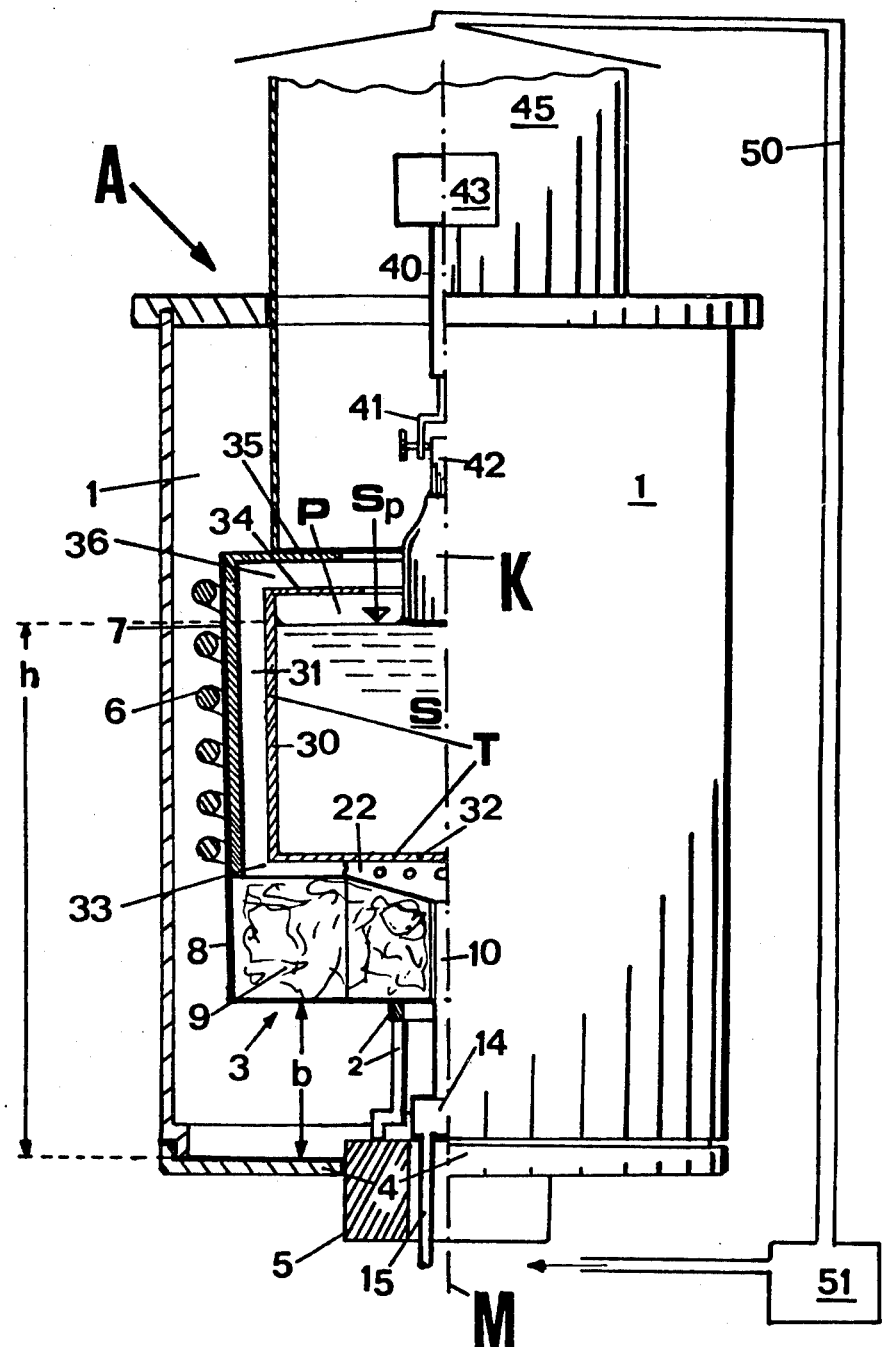

United States Patent [19]

Schmidt

[11] 4,233,270
[45] Nov. 11, 1980

[54] PROCESS AND DEVICE FOR GROWING CRYSTAL

[75] Inventor: Walter Schmidt, Schaffhausen, Switzerland

[73] Assignee: Swiss Aluminium Ltd., Chippis, Switzerland

[21] Appl. No.: 955,619

[22] Filed: Oct. 30, 1978

Related U.S. Application Data

[62] Division of Ser. No. 820,571, Aug. 1, 1977.

[30] Foreign Application Priority Data

Aug. 5, 1976 [CH] Switzerland .................. 10043/76

[51] Int. Cl.³ .............................................. B01J 17/18
[52] U.S. Cl. .............................. 422/249; 156/617 SP; 156/DIG. 83
[58] Field of Search ............. 156/617 V, 617 SP, 619, 156/DIG. 83; 422/248, 249

[56] References Cited

PUBLICATIONS

IBM Technical Bulletin, vol. 15, No. 5, Oct. 72, p. 1520.
"Crucible-Base Cooling . . .", Cockayne et al., Journal of Crystal Growth, 15, No. 3, pp. 167–170, North-Holland Pblg.

*Primary Examiner*—Frank Sever
*Attorney, Agent, or Firm*—Robert H. Bachman

[57] ABSTRACT

Iridium from the crucible wall, taken into solution during the growth of crystals by the Czochralski technique, is trapped at the bottom of the iridium crucible by cooling at least the bottom of the crucible. This part of the crucible is cooled to a temperature above the solidification temperature of the melt and results in almost inclusion-free crystals.

13 Claims, 4 Drawing Figures

PROCESS AND DEVICE FOR GROWING CRYSTAL

This is a division of application Ser. No. 820,571, filed Aug. 1, 1977, presently pending.

The invention concerns a process for growing crystals out of a hot melt in a heated crucible, and concerns in particular the growing of single crystals by the Czochralski technique using an iridium crucible. Furthermore the invention concerns a device for carrying out the process.

The growing of high melting point crystals generally involves the use of crucibles which are made of iridium with a melting point of 2454° C., and in which a melt is prepared. A so called seeding crystal is lowered into this melt and then raised again slowly out of the melt, while controlling temperature and rate of movement, with the result that a large cylindrical crystal is formed on the relatively small seed crystal.

A particular disadvantage of the present day iridium crucibles is their relatively short service life. This problem is mainly due to corrosion during the growing operation which can last as a rule from several hours to some days. This corrosion occurs in spite of the relatively good resistance towards oxidizing substances; the inside of the crucible is so strongly attacked by the melt that the surface becomes increasingly rough and, since it becomes larger, is corroded to an increasing extent.

The iridium which has dissolved in the melt can then, at sufficiently high concentration, precipitate out on relatively cool places for example at the surface of the melt or at the interface with the growing crystal, and does so in the form of small crystals up to 100 $\mu$m in size. These three to six cornered iridium particles can then become entrapped in the growing crystal.

Such iridium inclusions belong to the category of crystal defects which are very difficult to eliminate. They appear either individually or in the form of bands in the crystal. The concentration of inclusions varies from almost inclusion-free to some hundreds of inclusions per cubic centimeter of crystal. Since each inclusion produces a stress field which is much greater than the size of the particle itself, the inclusions represent relatively large defects. Furthermore, each inclusion is a potential source of dislocations which impair the quality of the crystal even more.

With these facts in mind the inventor set himself the task of improving the process of the kind described at the beginning, and of developing a device with the help of which inclusions are to a large degree prevented from forming in growing crystals.

In tackling this problem the inventor had the idea to cool at least the bottom of the crystal, and the lowest part of the melt on the bottom of the crystal, to a temperature above the solidification temperature of the melt during the growing stage and so to provide a cool spot as a nucleus to precipitate impurities out of the melt. This apparently contradictory measure viz., heating a crucible to a high temperature and at the same time cooling it, leads in practice to almost inclusion-free crystals.

In accordance with a further feature of the process of the invention the cool regions are produced at the bottom of the crucible and the dissolved impurities, in particular iridium are precipitated out. The supersaturation of iridium required for precipitation on the bottom of the crucible is smaller than that which leads to heterogeneous precipitation of iridium particles in the melt. The precipitated iridium is captured at the bottom of the crucible and therefore can no longer enter the crystal.

In order to cool at least the bottom of the crucible that part of the crystal, usefully outside the melt is jetted with a coolant, for example with pure nitrogen.

It is within the scope of the invention to blow inert gas as coolant onto the whole of the outer surface of the crucible; the corrosion of the wall of the crucible is thus reduced and the service life of the crucible increased. In the case of both the described cooling with nitrogen and the removal of heat in any other manner, care is to be taken that the temperature of the crucible bottom does not fall below the solidification temperature of the melt, since otherwise solid material, for example gadolinium-gallium-garnet (GGG), will crystallize out from the melt and would destroy the nucleation effect on the iridium. Furthermore, in an extreme case the growing lump of solidified melt could push against the growing crystal.

The device according to the invention for carrying out the process is such that there is a crucible which can be cooled, whereby preferably at least the bottom of the crucible delimits a space in which a coolant can flow and a feed pipe for coolant is connected to this space.

Usefully a space for the flowing coolant is provided in the center at the bottom of the crucible in order to achieve the strongest cooling in the center and to bring about the precipitation of impurities there.

That space is, in accordance with the invention, surrounded by a ring-shaped collar which also supports the crucible. The space is also, connected to the space surrounding the crucible bottom via holes in the ring-shaped collar, so that the coolant can emerge from under the crucible into the subsequent surrounding hollow space, the bottom and side of the crucible form parts of a larger space in which the coolant flows. That space in which the coolant flows is delimited by the crucible bottom and wall on the one hand and by the wall and bottom of a container around the crucible on the other hand. The bottom of the container is provided with an insulating layer in order to increase the effect of the coolant.

The container surrounds therefore the crucible containing the melt and is at a distance from the crucible, so that the space where the coolant flows around the crucible can be produced without any special technical effort. Alone the simplicity of the arrangement shows, with respect to the improvement in crystal growth which can be achieved with it, the great progress inherent in the invention.

The coolant or gas reaches the space beneath the crucible, in a preferred version of the invention, via a riser pipe arranged in the region of the axis of the device, and from there forms a cooling mantle around the crucible. The spent coolant flows into a waste gas unit positioned above the crucible and can, if desired, be fed to the riser pipe again via a regeneration circuit.

In particular with regard to the wish for a constant temperature in the region of the crucible bottom, also in cases where the melt temperature fluctuates, the supply of the coolant should be regulated automatically and cut back at about the end of the growing process. For this purpose a throttle valve or similar regulating device is built into the coolant supply line and regulates the flow of coolant in accordance with the actual melt temperature.

Further advantages, features and details of the invention are revealed by way of the following description of a preferred embodiment and with the help of drawings viz., FIG. 1: A crystal growing device shown partly in cross section.

Figure 2:
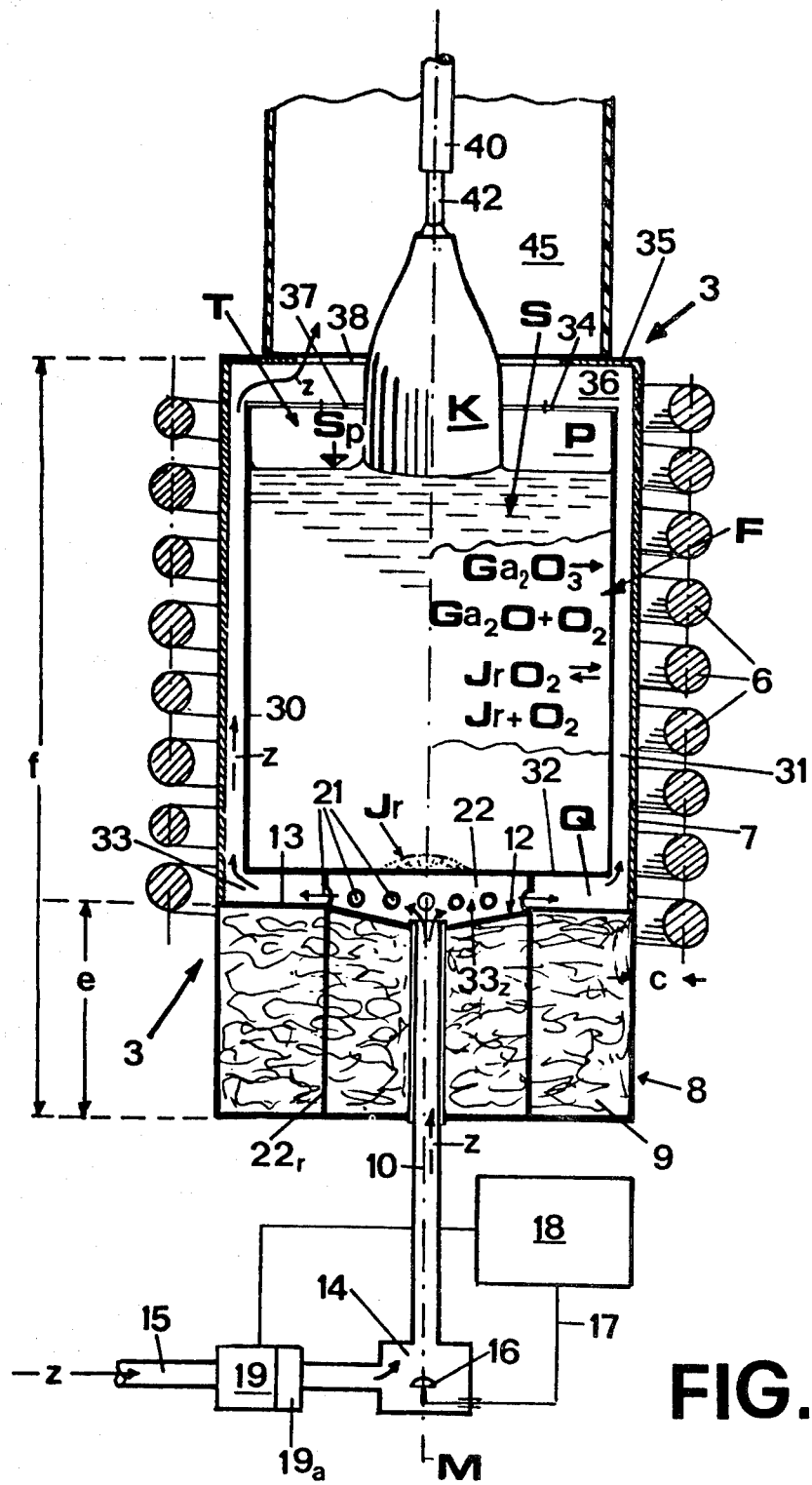

FIG. 2: An enlargement of part of the device shown in FIG. 1, showing a cross sectional view and more detail.

Figure 3:
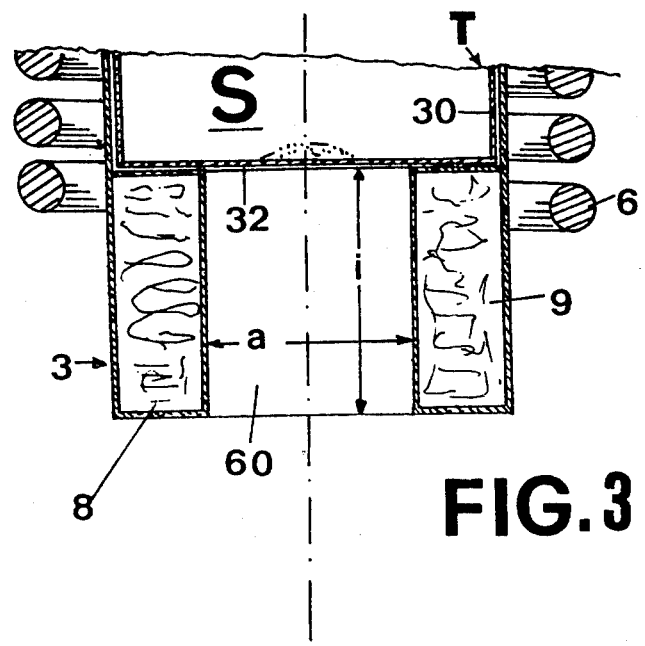

FIG. 3: Enlargement of further embodiments of the invention

Figure 4:
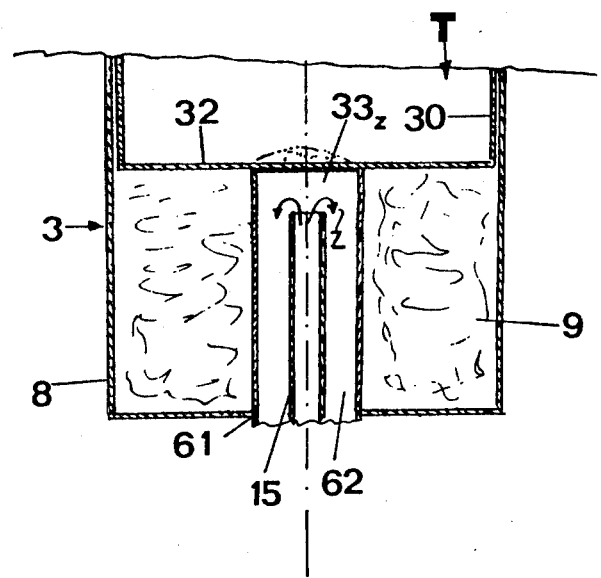

FIG. 4: showing details in cross sectional views.

In the housing 1 of a device A for growing crystals K—for example for growing single crystals by the so called Czochralski technique—a container 3 rests on a supporting frame around the axis M of the device A, the distance b of which container 3 to the bottom plate 4 of the housing 1 can be changed in the direction of the axis M by means of a raising device 5.

The container 3, surrounded at a distance c from its cylindrical wall 7 by a high frequency induction coil 6, has a hollow part 8 at the bottom, which is of length e viz., about one third of the total height f of the container 3. The hollow part 8 of the container 3 is filled with an insulating material 9 and, in the region of the axis M of the device A is penetrated by a riser pipe 10 which lies coaxial to the axis M, the pipe 10 opening into the space Q in the container 3 above the base plate 3, and ending at the lower end in a chamber 14 which can for example be rectangular or cubic in shape. From this chamber 14 there projects a pipe-shaped supply line 15 running down from the housing 1 and connected to a nitrogen gas supply which is not shown here in any greater detail.

As shown in FIG. 2 the rectangular chamber 14 contains a photocell 16 which is connected to a regulator 18 via a cable 17; this regulator 18 controls, as a function of signals from the photocell 16, a valve 19 in the gas supply pipe 15 and thus regulates the amount of gas flowing; this quantity can be registered by means of a gas flow meter 19a.

A crucible T made of iridium and of capacity P contains a melt—in the example chosen a melt S of gadolinium-gallium-garnet (GGG)—and sits inside the container 3 in space Q resting on a ring-shaped collar 22 which is penetrated by channels 21. The ring shaped collar 22 is fitted onto stiffening element 22r which is provided in the bottom 8 of container 3. The surface $S_P$ of the melt which sinks during the growth process can be kept at a constant level h with respect to the base plate 4 of the housing 1 by means of the raising facility 5.

The cylindrical wall 30 of the crucible T together with the wall 7 of the container 3 forms a ring-shaped space 31 which connects up at one end to the space 33 between the cover plate 13 of the bottom part 8 of the container 3 and the bottom 32 of the crucible T, and at the other end joins up with the space 36 between lid 34 of the crucible T and the lid 35 of the container 3.

Flat ring shaped elements with central holes 37 and 38 (FIG. 2) serve as crucible lid 34 and container lid 35 respectively.

Above the central holes 37 and 38 in the crucible lid 34 and container lid 35 respectively as can be seen in FIG. 1, there is a vertical rod 40 for drawing up with it a coaxially positioned seed crystal 42 held by means of a clamping device 41; as the seed crystal 42 is pulled out of the melt S which is at about 1800° C., it moves in a controlled manner regulated by the regulating facility 43, and a crystal K grows onto the said seed crystal 41.

Gaseous nitrogen flows in the direction shown by the arrow z (FIG. 2) out of the gas supply pipe 15 into the rectangular shaped container 14 and from this through the riser pipe 10 into the ring-shaped collar 22.

Inside the space $33_z$ surrounded by the ring-shaped collar 22 the stream of nitrogen 2 works as a coolant on the supported crucible bottom 32 and flows further, still acting as a coolant, through the recess 21 in the space 33 in the bottom of the crucible. The nitrogen or coolant z then rises in the ring-shaped gap 31 and leaves the container 3 via the hole 38 in the lid of the container 3. A waste gas pipe 45 is provided on the lid 35 of the container 3 to lead away the coolant z. The spent coolant z can then, as shown in FIG. 1, be led off via a pipe 50 and a regenerator 51 (shown only symbolically here) and recycled to the gas supply pipe 15.

In FIG. 2 a field F is indicated, in which in the example selected here, the $Ga_2O_3$ in the melt S is broken down to $Ga_2O + O_2$ at the cylindrical wall 30 of the iridium crucible T heated by the induction coil 6. The precipitated oxygen oxidizes the iridium; the $IrO_2$ itself then breaks down to $Ir + O_2$.

The cooled base 32 of the crucible forms, especially adjacent to the space $33_z$ made by the ring shaped collar 22, a zone for nucleating and collecting the iridium Ir in the melt S dissolved from the cylindrical wall 30. This Iridium is trapped at the bottom 32 of the crucible and thus is kept away from the growing crystal K.

In order to prevent the temperature of the cooled crucible bottom 32 from falling below the solidification temperature of the melt S—which would cause solid GGG to crystallize out on the bottom of the crucible—the feed of the coolant is regulated by the valve 19 with the help of the photocell 16 and the regulator 18.

The automatic control of the coolant or gas supply, which is required to achieve a constant temperature at the bottom 32 of the crucible is thus attained. Furthermore, it is possible to reduce the flow of gas towards the end of the growing process in order to counteract the well known sinking of the effective temperature in the center of the crucible bottom 32 during the growing process and so obtain a constant temperature at the bottom of the crucible.

In an exemplified embodiment of the invention which is of simple construction, there is provided below the center of the crucible bottom 32 a hole 60 of width a which can be freely chosen and of depth i as shown in FIG. 3; the heat radiated through this hole 60 is greater than from the other, ring-shaped part of the crucible bottom.

In the example shown in FIG. 4 a control pipe 61 extends up to the bottom of the crucible and into it there projects a feed pipe 15 for the supply of gases or other coolants z which are led off again in the annular space 62 between the feed pipe 15 and surrounding pipe 61 after impinging on the crucible bottom 32 in the space 33.

Not shown here is another embodiment of the invention in which one end of a solid thermal conductor is in contact with the central part of the bottom of the crucible and the other end is cooled by means of a coolant.

What is claimed is:

1. A device for growing single crystals from a melt in a heated iridium crucible using the Czochralski technique which melt is kept at a temperature substantially above the solidification temperature of said melt in a heated crucible, wherein iridium from said crucible contaminates said melt, which comprises means for cooling at least the bottom of said crucible contacting said melt and the lowest part of the melt resting on the bottom to a temperature above the solidification temperature of said melt but low enough to precipitate said iridium, means for providing an annular space between substantially all of the side walls of said crucible and container for coolant flow in said space, flow distribution means positioned and dimensioned beneath the crucible bottom to provide a greater cooling effect on the bottom of said crucible, said greater cooling effect being sufficient to precipitate said iridium, wherein said cooled region beneath the crucible bottom acts as a nucleation center for precipitation of dissolved iridium and wherein the iridium is precipitated from said region and remains there so that said iridium can no longer enter the crystal, and wherein the service life of the crucible is increased.

2. A device according to claim 1 which further comprises a container surrounding at least the bottom of said crucible and defining a space into which a coolant flows, and a coolant supply conduit for introducing a coolant into said space so as to cool a bottom portion of said crucible.

3. A device according to claim 2 in which said coolant supply conduit passes through the bottom of said container in the region of the center axis of the device.

4. A device according to claim 3 which further comprises means for removing spent coolant from the bottom of said crucible and a waste gas extractor fitted to said means for removing spent coolant.

5. A device according to claim 4 which further comprises a coolant regenerator connected to said coolant supply conduit and in which said waste gas extractor is connected to said coolant supply conduit via said regenerator.

6. A device according to claim 2 in which said coolant supply conduit projects coaxially through the base of said container, forming a ring-shaped space with said base for the removal of the coolant and ends at a distance from the bottom of said crucible.

7. A device according to claim 3 which further comprises a coolant regulating device for said coolant supply conduit to regulate the feed of coolant and prevent the temperature of the crucible from falling below the solidification temperature of the melt.

8. A device according to claim 7 which further comprises a sensor element connected to said regulating device for said coolant supply conduit projecting into the stream of coolant.

9. A device according to claim 3 which further comprises a flow meter provided in the coolant supply conduit.

10. A device according to claim 1 which further comprises a ring-shaped collar on which the crucible rests, at least a portion of the bottom of said crucible being spaced apart from said collar, and conduit means for flowing coolant through said collar into the space between said collar and the bottom of said crucible.

11. A device according to claim 10 which further comprises a stiffening element provided in the bottom of said container and in which said ring-shaped collar is fitted onto said stiffening element.

12. A device according to claim 1 which further comprises a container which surrounds the sides and the bottom of said crucible and in which the side walls and bottom of said container together with the sides and bottom of said crucible define a space through which fluid coolant can flow.

13. A device according to claim 12 which further comprises an insulating layer on the bottom of said container.

* * * * *